US012571823B2

(12) United States Patent
Lhuillier et al.

(10) Patent No.: US 12,571,823 B2
(45) Date of Patent: Mar. 10, 2026

(54) DETECTION OF LOSS OF NEUTRAL

(71) Applicant: SAGEMCOM ENERGY & TELECOM SAS, Rueil Malmaison (FR)

(72) Inventors: Pierre Lhuillier, Rueil Malmaison (FR); Sébastien Saint-Leger, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 291 days.

(21) Appl. No.: 18/343,669

(22) Filed: Jun. 28, 2023

(65) Prior Publication Data

US 2023/0417808 A1     Dec. 28, 2023

(51) Int. Cl.

| | |
|---|---|
| *G01R 22/06* | (2006.01) |
| *G01R 31/30* | (2006.01) |
| *G01R 31/54* | (2020.01) |
| *G01R 31/56* | (2020.01) |
| *G08B 21/18* | (2006.01) |

(52) U.S. Cl.
CPC ....... *G01R 22/068* (2013.01); *G01R 31/3004* (2013.01); *G01R 31/54* (2020.01); *G01R 31/56* (2020.01); *G08B 21/185* (2013.01)

(58) Field of Classification Search
CPC .. G01R 22/068; G01R 31/3004; G01R 31/54; G01R 31/56; G01R 29/16; G01R 31/086; G08B 21/185; H02J 3/26
See application file for complete search history.

(56) References Cited

U.S. PATENT DOCUMENTS

| | | | |
|---|---|---|---|
| 2004/0024545 A1* | 2/2004 | Tian ....................... | H02H 5/105 |
| | | | 702/60 |
| 2018/0211518 A1* | 7/2018 | Meranda ................ | G08C 19/12 |

FOREIGN PATENT DOCUMENTS

| | | | | |
|---|---|---|---|---|
| CN | 105759164 A | * | 7/2016 | ............. G01R 31/58 |
| DE | 102013016710 A1 | * | 1/2015 | ............... H02H 5/10 |

(Continued)

OTHER PUBLICATIONS

Jozef A. L. Ghijselen, "Exact Voltage Unbalance Assessment Without Phase Measurements", IEEE Transactions on Power Systems, vol. 20, No. I, Feb. 2005 (Year: 2005).*

(Continued)

*Primary Examiner* — Paresh Patel
*Assistant Examiner* — Dilara Sultana
(74) *Attorney, Agent, or Firm* — MUNCY, GEISSLER, OLDS & LOWE, P.C.

(57) ABSTRACT

A method for detecting a break in connection of a neutral of a three-phase electricity network, implemented in a processing unit of an item of electrical equipment connected to the electricity network includes acquiring, at a time T, a first phase voltage (V1), a second phase voltage (V2) and a third phase voltage (V3) measured by voltage sensors of the item of electrical equipment; evaluating a first quantity representative of a ratio between a maximum voltage and a minimum voltage from the first, second and third phase voltages; if the first quantity is greater than a predetermined threshold: evaluating, based on the first, second and third phase voltages, a second quantity; detecting a break in the neutral at the time T when the second quantity satisfies a predetermined reference criterion.

18 Claims, 6 Drawing Sheets

(56)  References Cited

FOREIGN PATENT DOCUMENTS

EP          3173800 A1    5/2017
WO      WO2015179908 A1    12/2015

OTHER PUBLICATIONS

A. Yu et al. "Delta-Connected Cascaded H-Bridge Multilevel Con-verters for Large-Scale Photovoltaic Grid Integration", EEE Trans-actions on Industrial Electronics, 64, 8877-8886.2016. (Year: 2016).*
B. Popa et al, "Some Power Quality Issues in Power Substation from Residential and Educational Buildings", The 10th Interna-tional Symposium on Advanced Topics in Electrical Engineering. Mar. 23-25, 2017, Bucharest, Romania (Year: 2017).*

* cited by examiner

DETECTION OF LOSS OF NEUTRAL

The invention relates to the field of electrical power distribution networks and equipment connected to said networks.

BACKGROUND OF THE INVENTION

An electricity distribution network is used to transport electrical power from a power generation unit to one or more connected electrical installations. Electrical power is generally transported in three-phase form, the electricity network then being made up of three phase conductors and one neutral conductor. An electricity network is also typically equipped with a plurality of electricity meters used to measure the electrical power consumed by the connected electrical installations.

In a three-phase electricity network, a break in the neutral connection may occur upstream of one or more meters. Such a break is the responsibility of the energy supplier in charge of the network and can cause major problems at the connected electrical installations. Indeed, depending on the load impedances of the connected electrical installations (downstream of the break point of the neutral), a significant imbalance of the phase voltages carried by the three phase conductors may occur. It is therefore possible for high voltages to be present at connected electrical installations, which may possibly destroy said installations.

It is therefore important to be able to reliably, simply and quickly detect a sudden break in the neutral connection in a three-phase electricity distribution network. This allows preventive and/or protective measures to be taken quickly for connected electrical installations.

Conventionally, the detection of a break in the connection of a neutral is based on the detection of an abnormal imbalance between the phase voltages of the distribution network and/or an absence of current flowing in the neutral conductor. However, this method is generally unreliable as it does not correctly identify whether the observed imbalance is related to a break in the neutral or to a break in one or more phases. Furthermore, detecting the absence of current through the neutral conductor requires the use of current sensors positioned on said neutral conductor, which increases costs and gives rise to physical and electrical implementation problems.

Another known method for detecting a break in the connection of a neutral is to measure the downstream load impedances (of the connected electrical installations) in order to determine the expected imbalance of the phase voltages in the event of a break in the neutral connection (and therefore to detect it when said imbalance actually occurs). However, the effectiveness and reliability of this method are directly related to the reliability of the downstream load impedance measurements. This is a limiting factor, because determining the expected imbalance between the phase voltages typically uses a theoretical analysis for which the downstream load impedances are assumed to be linear and constant over time (which is not necessarily the case in reality). Moreover, in the event that the break in neutral affects several electricity meters, each having distinct (uncorrelated) and unbalanced downstream load impedances, the method described above can no longer detect the break in the neutral connection. Indeed, for a given meter, the measured downstream load impedance only considers the electrical installations downstream of this meter. However, the imbalance between the phase voltages is linked to the equivalent downstream load impedance resulting from the combination of all the downstream load impedances of all the meters affected by the break in the neutral connection. Since the equivalent load impedance is not measurable, the method described above is no longer applicable in this case.

OBJECT OF THE INVENTION

The object of the invention is a method for detecting, in an electricity distribution network, a break in the connection of a neutral upstream of one or more electricity meters in a quick, simple and reliable manner.

SUMMARY OF THE INVENTION

In order to achieve this object, a method for detecting a break in connection of a neutral of a three-phase electricity network is proposed, the detection method being implemented at least partially in a processing unit of an item of electrical equipment connected to the electricity network, and comprising the steps, repeated regularly, of:

acquiring, at a time T, a first phase voltage measured between a first phase of the three-phase electricity network and the neutral, a second phase voltage measured between a second phase and the neutral, and a third phase voltage measured between a third phase and the neutral, the first, second and third phase voltages being measured by voltage sensors of the item of electrical equipment;

evaluating a first quantity representative of a ratio between a maximum phase voltage and a minimum phase voltage from the first, second and third phase voltages;

if the first quantity is greater than a predetermined threshold:

evaluating, based on the first, second and third phase voltages, at least a second quantity representative of a current balance between said first, second and third phase voltages;

detecting a break in connection of the neutral at the time T when the at least one second quantity satisfies a predetermined reference criterion.

The detection method according to the invention is therefore particularly advantageous because it makes it possible to detect a break in the connection of a neutral in a distribution network (upstream of an electricity meter) from the simple measurement of the phase voltages carried by the phase conductors of said network. The detection method is therefore simple to implement (because it only requires voltage sensors) and inexpensive.

Furthermore, the detection method according to the invention is also highly reliable because, when there is a suspected break in the neutral (i.e., when the first quantity is greater than the predetermined threshold), the second quantity is evaluated and makes it possible to confirm without any possible doubt that a break in the neutral connection has indeed occurred.

Since the second quantity is evaluated directly on the basis of the phase voltages (the second quantity is evaluated only on the basis of the first, second and third phase voltages and therefore does not require any additional measurements), the detection method according to the invention can quickly detect a break in the neutral connection.

Moreover, a detection method as previously described is proposed, in which the at least one second quantity comprises a second quantity that is a function of a sum of pairwise products of root mean square values of the first, second and third phase voltages.

$$G2G2 = \sqrt{\frac{1}{3}(V_{1eff}V_{2eff} + V_{2eff}V_{3eff} + V_{3eff}V_{1eff})}$$ (5)

a detection method as previously described is proposed, in which said second quantity is equal to:

$$G2_{G2} = \sqrt{\frac{1}{3}(V_{1eff}V_{2eff} + V_{2eff}V_{3eff} + V_{3eff}V_{1eff})},$$ (10)

where $V_{1eff}$, $V_{2eff}$ and $V_{3eff}$ are respectively a root mean square value of the first phase voltage, a root mean (15)

$V_{1eff}=\alpha_1 \cdot V_{nom}$     $V_{2eff}=\alpha_2 \cdot V_{nom}$     $V_{3eff}=\alpha_3 \cdot V_{nom}$
BorneInf=min(B1, B2, B3, B4, B5, B6)BornSup=max (B1, B2, B3, B4, B5, B6) Moreover, a detection method as previously described is proposed, in which, if said condition is not met, and if:

$V_{1eff}=\alpha_1 \cdot V_{nom}$     $V_{2eff}=\alpha_2 \cdot V_{nom}$     $V_{3eff}=\alpha_3 \cdot V_{nom}$
BorneInf=min(B1, B2, B3, B4, B5, B6)BornSup=max (B1, B2, B3, B4, B5, B6) and and, where $a_1$, $a_2$ and $a_3$ are real coefficients such that:

$V_{1eff}=\alpha_1 \cdot V_{nom}$     $V_{2eff}=\alpha_2 \cdot V_{nom}$     $V_{3eff}=\alpha_3 \cdot V_{nom}$
BorneInf=min(B1, B2, B3, B4, B5, B6)BornSup=max (B1, B2, B3, B4, B5, B6) and $V_{1eff}=\alpha_1 \cdot V_{nom}$     $V_{2eff}=\alpha_2 \cdot V_{nom}$     $V_{3eff}=\alpha_3 \cdot V_{nom}$
BorneInf=min(B1, B2, B3, B4, B5, B6)BornSup=max (B1, B2, B3, B4, B5, B6), where $$B1 = \sqrt{\frac{\sqrt{(a_1^2 + a_2^2 + a_1a_2)(a_1^2 + a_3^2 + a_1a_3)}}{3}} V_{nom},$$

$$B2 = \sqrt{\frac{\sqrt{(a_2^2 + a_3^2 + a_2a_3)(a_2^2 + a_1^2 + a_2a_1)}}{3}} V_{nom},$$

$$B3 = \sqrt{\frac{\sqrt{(a_3^2 + a_1^2 + a_3a_1)(a_3^2 + a_2^2 + a_3a_2)}}{3}} V_{nom},$$

$$B4 = \sqrt{\frac{2\sqrt{(4a_1^2 + a_2^2 + a_3^2 + 2a_1a_2 + 2a_1a_3 - a_2a_3)(a_2^2 + a_3^2 + a_2a_3)} + (a_2^2 + a_3^2 + a_2a_3)}{12}} V_{nom},$$

$$B5 = \sqrt{\frac{2\sqrt{(4a_2^2 + a_3^2 + a_1^2 + 2a_2a_3 + 2a_2a_1 - a_3a_1)(a_3^2 + a_1^2 + a_3a_1)} + (a_3^2 + a_1^2 + a_3a_1)}{12}} V_{nom},$$

$$B6 = \sqrt{\frac{2\sqrt{(4a_3^2 + a_1^2 + a_2^2 + 2a_3a_1 + 2a_3a_2 - a_1a_2)(a_1^2 + a_2^2 + a_1a_2)} + (a_1^2 + a_2^2 + a_1a_2)}{12}} V_{nom}.$$

square value of the second phase voltage and a root (40) mean square value of the third phase voltage,
BorneInf≤G2≤BorneSup the predetermined reference criterion being that:
BorneInf≤G2≤BorneSup.
Moreover, a detection method as previously described is (45) proposed, further comprising the steps of:
detecting whether:

$V_{1eff}=V_{nom}$ and $V_{2eff}=V_{nom}$ and $V_{3eff}=V_{nom}$, where $V_{nom}$ is a nominal root mean square value of the (50) phase voltage of the electricity network;

$$BorneInfBorneSupBorneInf = V_{nom}BorneSup = \sqrt{\frac{2\sqrt{3}+1}{4}} V_{nom}.$$ (55)

if this condition is met, defining and as follows:

$$BorneInfBorneSupBorneInf = V_{nom}BorneSup = \sqrt{\frac{2\sqrt{3}+1}{4}} V_{nom} \text{ and}$$

$$BorneInfBorneSupBorneInf = V_{nom}BorneSup = \sqrt{\frac{2\sqrt{3}+1}{4}} V_{nom}.$$ (65)

Moreover, a detection method as previously described is proposed, in which the at least one second quantity comprises a second quantity that is a function of an area of an actual triangle formed by the first, second and third phase voltages in the Fresnel diagram.

$$A = \frac{1}{2}(V_{1eff}V_{2eff}\sin\varphi_{12} + V_{2eff}V_{3eff}\sin\varphi_{23} + V_{3eff}V_{1eff}\sin\varphi_{31})A_{ref} - \varepsilon_1 \leq$$

$$A \leq A_{ref} + \varepsilon_1$$

Moreover, a detection method as previously described is proposed, in which the area of the actual triangle is determined by using the formula: where A is the second quantity, $V_{1eff}$, $V_{2eff}$ and $V_{3eff}$ are respectively the root mean square values of the first, second and third phase voltages, and $\varphi_{12}$ is a first phase shift between the first phase voltage and the second phase voltage, $\varphi_{23}$ is a second phase shift between the second phase voltage and the third phase voltage and $\varphi_{31}$ is a third phase shift between the third phase voltage and the first phase voltage, the reference criterion then being that the second quantity is such that:

$$A = \frac{1}{2}(V_{1eff}V_{2eff}\sin\varphi_{12} + V_{2eff}V_{3eff}\sin\varphi_{23} + V_{3eff}V_{1eff}\sin\varphi_{31})$$

where $A_{ref}$ is an area of a reference triangle and $\varepsilon_1$ is a first predetermined measurement uncertainty.

Moreover, a detection method as previously described is proposed, in which, if the first, second and third phase voltages are perfectly balanced, the area of the predetermined reference triangle is evaluated by using the formula:

$$A_{ref} = \frac{3\sqrt{3}}{4} V_{nom},$$

where $A_{ref}$ is the area of the reference triangle and $V_{nom}$ is the nominal root mean square value of the phase voltage of the electricity network.

$U_{12}U_{23} \quad U_{31}\Phi_1 - \varepsilon_2 \leq U_{12} \leq \Phi_1 + \varepsilon_2 - \varepsilon_2 \leq U_{23} \leq \Phi_2 + \varepsilon_2 \Phi_3 - \varepsilon_2 \leq U_{31} \leq \Phi_3 + \varepsilon_2$ Moreover, a detection method as previously described is proposed, in which the at least one second quantity comprises second quantities which comprise a first line-to-line voltage representative of a difference between the first phase voltage and the second phase voltage, a second line-to-line voltage representative of a difference between the second phase voltage and the third phase voltage and a third line-to-line voltage representative of a difference between the third phase voltage and the first phase voltage, the reference criterion then being that:

$$U_{12}U_{23}U_{31}\Phi_1 - \varepsilon_2 \leq U_{12} \leq \Phi_1 + \varepsilon_2 \Phi_2 - \varepsilon_2 \leq U_{23} \leq \Phi_2 + \varepsilon_2 \Phi_3 - \varepsilon_2 \leq U_{31} \leq \Phi_3 + \varepsilon_2 \text{ and}$$

$$U_{12}U_{23}U_{31}\Phi_1 - \varepsilon_2 \leq U_{12} \leq \Phi_1 + \varepsilon_2 \Phi_2 - \varepsilon_2 \leq U_{23} \leq \Phi_2 + \varepsilon_2 \Phi_3 - \varepsilon_2 \leq U_{31} \leq \Phi_3 + \varepsilon_2 \text{ and}$$

$$U_{12}U_{23}U_{31}\Phi_1 - \varepsilon_2 \leq U_{12} \leq \Phi_1 + \varepsilon_2 \Phi_2 - \varepsilon_2 \leq U_{23} \leq \Phi_2 + \varepsilon_2 \Phi_3 - \varepsilon_2 \leq U_{31} \leq \Phi_3 + \varepsilon_2 \text{ and}$$

$U_{12}U_{23} \quad U_{31}\Phi_1 - \varepsilon_2 \leq U_{12} \leq \Phi_1 + \varepsilon_2 \Phi_2 - \varepsilon_2 \leq U_{23} \leq \Phi_2 + \varepsilon_2 \Phi_3 - \varepsilon_2 \leq U_{31} \leq \Phi_3 + \varepsilon_2$ where $\Phi_1$, $\Phi_2$ and $\Phi_3$ are reference values of the first, second and third line-to-line voltages measured during operation at a reference time $T_0$ preceding the time $T$ and $\varepsilon_2$ is a second predetermined measurement uncertainty.

Moreover, a detection method as previously described is proposed, in which the at least one second quantity comprises second quantities that comprise a first phase shift between the first phase voltage and the second phase voltage, a second phase shift between the second phase voltage and the third phase voltage and a third phase shift between the third phase voltage and the first phase voltage, the predetermined reference criterion then being that the first, second and third phase shifts are each non-zero and different to 120 degrees.

Moreover, a detection method as previously described is proposed, further comprising the step of detecting a break in the neutral connection when it has been detected that the second quantity satisfies the predetermined reference criterion a predetermined number of times, corresponding to consecutive instances it is satisfied, spaced apart two by two in time by a predetermined duration.

Moreover, a detection method as previously described is proposed, in which, when a break in the neutral connection has been detected, the method further comprises the step of generating an alarm signal that can be timestamped in a memory of the item of electrical equipment and/or that can be transmitted to an item of equipment external to said item of electrical equipment.

Also proposed is an item of electrical equipment comprising voltage sensors and a processing unit arranged to implement the detection method as previously described.

Also proposed is an item of electrical equipment as previously described, the item of electrical equipment being an electricity meter.

Also proposed is a computer program comprising instructions that cause the item of electrical equipment as previously described to perform the steps of the detection method as previously described.

Also proposed is a computer-readable storage medium on which the previously described computer program is stored.

The invention shall be better understood in the light of the following description of specific and non-limiting embodiments of the invention.

BRIEF DESCRIPTION OF THE DRAWINGS

Reference is made to the appended drawings in which.

DETAILED DESCRIPTION OF THE INVENTION

Figure 1:
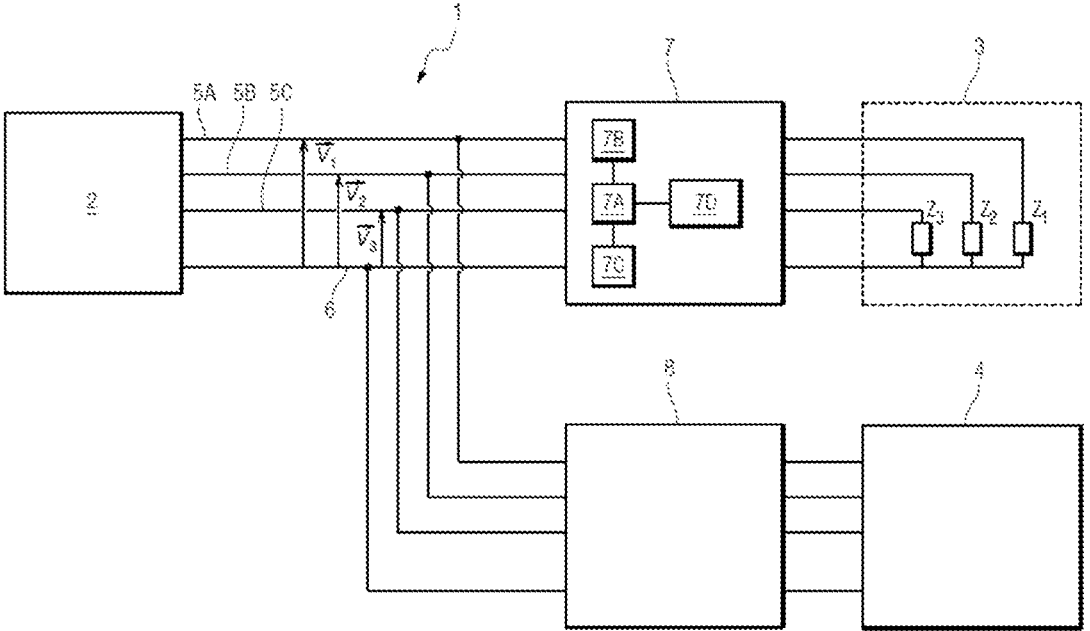
FIG. 1 shows a three-phase electricity distribution network.

In reference to FIG. 1, an electricity distribution network 1 is shown. The distribution network 1 allows electrical power to be transported from a power generation unit 2 to one or more electrical installations, in this instance a first electrical installation 3 and a second electrical installation 4.

The distribution network 1 is a three-phase electricity network that comprises a first phase conductor 5A, a second phase conductor 5B, a third phase conductor 5C and a neutral conductor 6. For the sake of simplicity, the term "conductor" shall be omitted hereinafter in the description, with reference being made simply to a first phase 5A, a second phase 5B, a third phase 5C and a neutral 6.

The distribution network 1 carries a first phase voltage $V_1$ between the first phase and the neutral 6, a second phase voltage $V_2$ between the second phase 5B and the neutral 6 and a third phase voltage $V_3$ between the third phase 5C and the neutral 6. The first, second and third phase voltages $V_1$, $V_2$, $V_3$ are alternating (sinusoidal) voltages with a frequency of 50 Hz.

Figure 2:
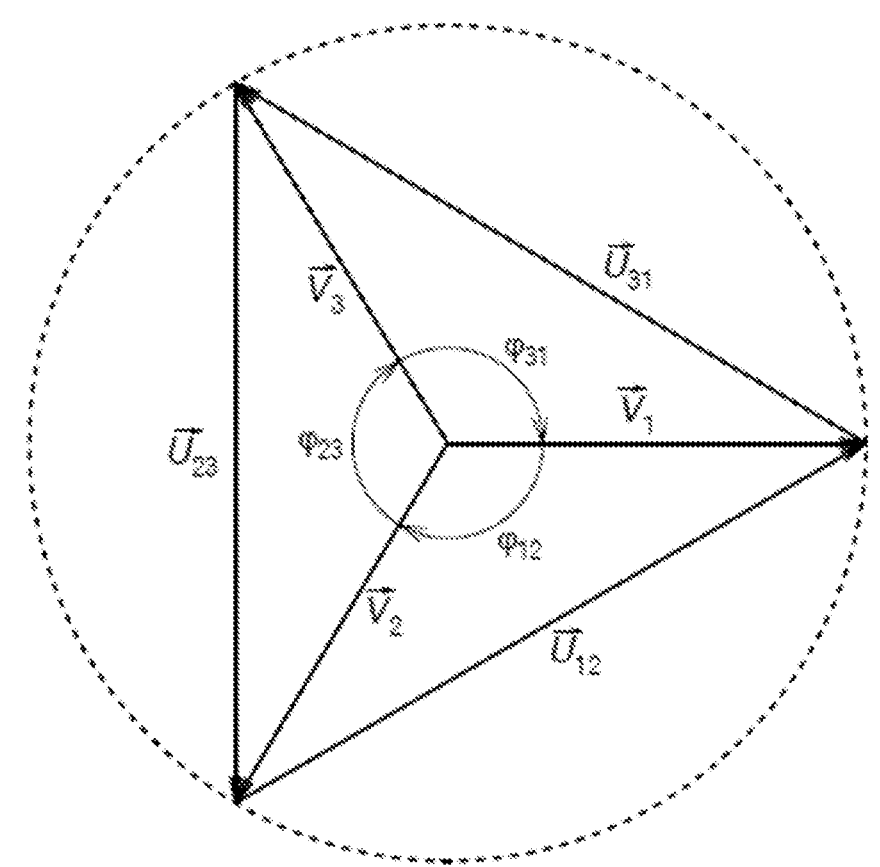
FIG. 2 shows a Fresnel diagram of the phase voltages of the distribution network shown in FIG. 1 in nominal conditions.

FIG. 2 shows the first phase voltage $V_1$, the second phase voltage $V_2$ and the third phase voltage $V_3$ in the Fresnel diagram when the distribution network 1 is operating in nominal conditions.

The root mean square value of the first phase voltage $V_{1eff}$, the root mean square value of the second phase voltage $V_{2eff}$ and the root mean square value of the third phase voltage $V_{3eff}$ are all equal to the nominal root mean square value of the phase voltage, identified as $V_{nom}$, which is equal to 230V.

Moreover, the first, second and third phase voltages $V_1$, $V_2$, $V_3$ are each out of phase with one another. Therefore, a first phase shift $\varphi_{12}$ is present between the vector representation of the first phase voltage $V_1$ and that of the second phase voltage $V_2$, a second phase shift $\varphi_{23}$ is present between the vector representation of the second phase voltage $V_2$ and that of the third phase voltage $V_3$ and a third phase shift $\varphi_{31}$ is present between the vector representation of the third phase voltage $V_3$ and that of the first phase voltage $V_1$. The first phase shift $\varphi_{12}$, the second phase shift $\varphi_{23}$ and the third phase shift $\varphi_{31}$ are all equal to 120°.

Figure 3:
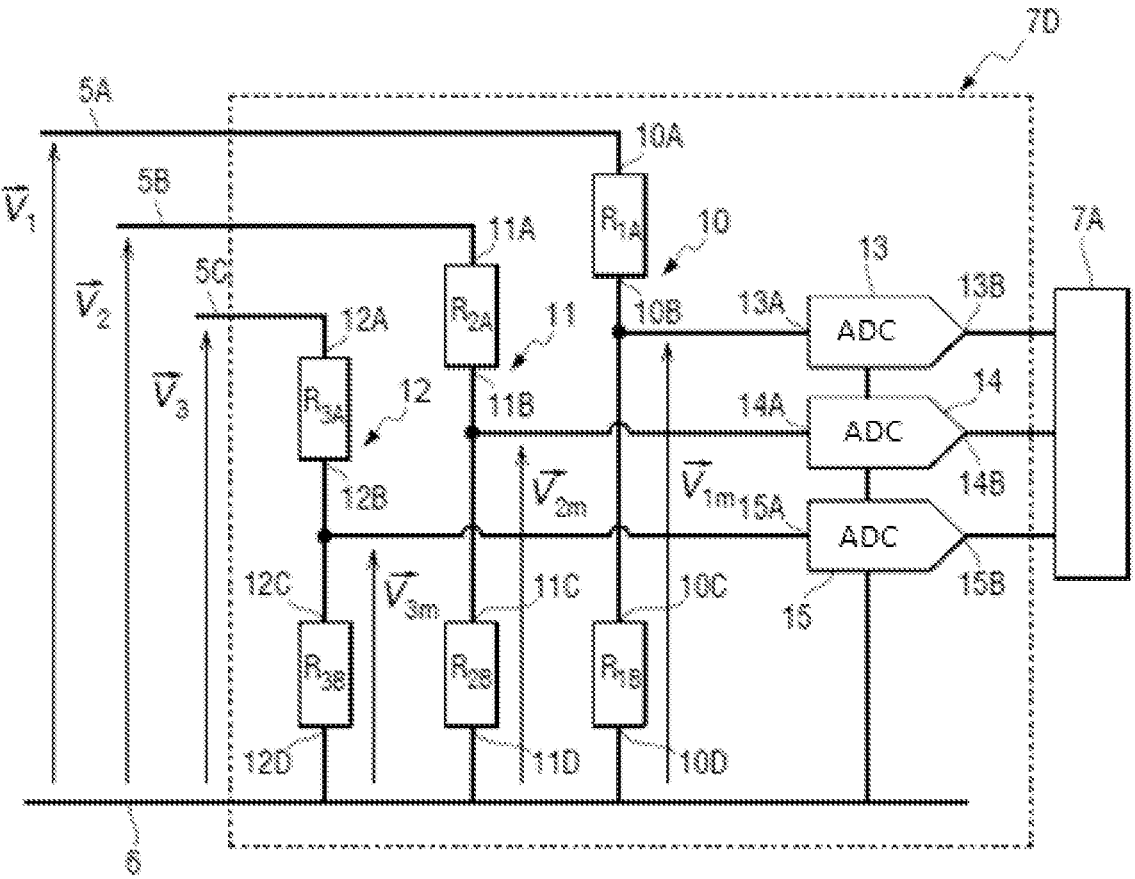
FIG. 3 shows an electronic architecture of the voltage sensors of an electricity meter of the distribution network shown in FIG. 1.

FIG. 3 also shows a first line-to-line voltage $U_{12}$ which corresponds to a difference between the first phase voltage $V_1$ and the second phase voltage $V_2$, a second line-to-line voltage $U_{23}$ which corresponds to a difference between the second phase voltage $V_2$ and the third phase voltage $V_3$ and a third line-to-line voltage $U_{31}$ which corresponds to a difference between the third phase voltage $V_3$ and the first phase voltage $V_1$.

In reference once more to FIG. 1, a first meter 7 is connected to the distribution network 1 between the generation unit 2 and the first installation 3. The first meter 7 is intended to measure the consumption of electrical power supplied to the first installation 3 via the distribution network 1. The first installation 3 is in this instance represented by a first electrical impedance $Z_1$ connected between the first phase 5A and the neutral 6, by a second electrical impedance $Z_2$ connected between the second phase 5B and the neutral 6 and by a third electrical impedance connected between the third phase 5C and the neutral 6. Therefore, during operation in nominal conditions, the first impedance $Z_1$ has the first phase voltage $V_1$ at its terminals, the second impedance $Z_2$ has the second phase voltage $V_2$ at its terminals and the third impedance $Z_3$ has the third phase voltage $V_3$ at its terminals.

A second meter 8 is also connected to the distribution network between the generation unit 2 and the second installation 4. The second meter 8 is intended to measure the consumption of electrical power supplied to the second installation 4 via the distribution network 1.

The first meter 7 and the second meter 8 are three-phase meters.

The architecture of the first meter 7 will now be described.

The first meter 7 comprises a processing unit 7A which comprises at least one processing component which may be a DSP (Digital Signal Processor), a processor, a microcontroller, an FPGA (Field-Programmable Gate Array) or an ASIC (Application-Specific Integrated Circuit).

The first meter 7 further comprises a memory 7B connected to the processing unit 7A or integrated into the processing unit 7A. The memory 7B forms a computer-readable storage medium, on which at least one computer program is stored comprising instructions for at least partially implementing the detection method described below.

The first meter 7 further comprises a communication module 7C connected to the processing unit 7A and arranged to transmit data using PLC (Power Line Communication) technology. It should be noted that other communication standards may be used, cellular radio technology, for example.

The first meter 7 further comprises voltage sensors 7D connected to the processing unit 7A and arranged to measure the first phase voltage $V_1$, the second phase voltage $V_2$ and the third phase voltage $V_3$ of the distribution network 1.

The voltage sensors 7D of the first meter 7 will now be described in greater detail in reference to FIG. 3.

The voltage sensors 7D comprise a first branch 10, a second branch 11 and a third branch 12.

The voltage sensors further comprise a first analogue-to-digital converter 13, a second analogue-to-digital converter 14 and a third analogue-to-digital converter 15. In order to simplify the description, they will be referred to hereinafter as the first ADC 13, the second ADC 14 and the third ADC 15.

The first branch 10 comprises two first resistors $R_{1A}$, $R_{1B}$. The first resistor $R_{1A}$ comprises a first terminal 10A connected to the first phase 5A and a second terminal 10B connected to an input 13A of the first ADC 13. The first resistor $R_{1B}$ comprises a first terminal 10C connected to the input 13A of the first ADC 13 and a second terminal 10D connected to the neutral 6. The two first resistors $R_{1A}$, $R_{1B}$ thus form a voltage divider bridge between the first phase 5A and the neutral 6. A first measurement voltage $V_{1m}$ is therefore present between the input 13A of the first ADC 13 and the neutral 6. The first measurement voltage $V_{1m}$ is representative of the first phase voltage $V_1$ and is consistent with the input voltage range of the first ADC 13.

The second branch 11 comprises two second resistors $R_{2A}$, $R_{2B}$. The second resistor $R_{2A}$ comprises a first terminal 11A connected to the second phase 5B and a second terminal 11B connected to an input 14A of the second ADC 14. The second resistor R 2B comprises a first terminal 11C connected to the input 14A of the second ADC 14 and a second terminal 11D connected to the neutral 6. The two second resistors $R_{2A}$, $R_{2B}$ thus form a voltage divider bridge between the second phase 5B and the neutral 6. A second measurement voltage $V_{2m}$ is therefore present between the input 14A of the second ADC 14 and the neutral 6. The second measurement voltage $V_{2m}$ is representative of the second phase voltage $V_2$ and is consistent with the input voltage range of the second ADC 14.

The third branch 12 comprises two third resistors $R_{3A}$, $R_{3B}$. The third resistor $R_{3A}$ comprises a first terminal 12A connected to the third phase 5C and a second terminal 12B connected to an input 15A of the third ADC 15. The third resistor $R_{3B}$ comprises a first terminal 12C connected to the input 15A of the third ADC 15 and a second terminal 12D connected to the neutral 6. The two third resistors $R_{3A}$, $R_{3B}$ thus form a voltage divider bridge between the third phase 5C and the neutral 6. A third measurement voltage Vim is therefore present between the input 15A of the third ADC 15 and the neutral 6. The third measurement voltage $V_{3m}$ is representative of the third phase voltage $V_3$ and is consistent with the input voltage range of the third ADC 15.

The voltage divider bridges of each of the first, second and third branches 10, 11, 12 make it possible respectively to reduce the amplitudes of the first, second and third phase voltages $V_1$, $V_2$, $V_3$ in order to make them compatible with the measurement range of the first ADC 13, the second ADC 14 and the third ADC 15.

The first ADC 13 comprises an output 13B connected to the processing unit 7A. The first ADC 13 therefore produces first measurement samples representative of the first phase voltage $V_1$ and provides them to the processing unit 7A.

The second ADC 14 comprises an output 14B connected to the processing unit 7A. The second ADC 14 will therefore produce second measurement samples representative of the second phase voltage $V_2$ and provide them to the processing unit 7A.

The third ADC 15 comprises an output 15B connected to the processing unit 7A. The third ADC 15 will therefore produce third measurement samples representative of the third phase voltage $V_3$ and provide them to the processing unit 7A.

It is assumed that the first ADC 13, the second ADC 14 and the third ADC 15 all have suitable characteristics (number of bits, sampling frequency) to correctly convert the first measurement voltage $V_{1m}$, the second measurement voltage $V_{2m}$ and the third measurement voltage $V_{1m}$, respectively. In this instance, the first ADC 13, the second ADC 14 and the third ADC 15 each have a number of bits greater than or equal to 12 bits and a sampling frequency of at least 2 ksps (kilo samples per second).

The influence of a break in the connection of the neutral 6 in the distribution network 1 will now be described.

Figure 4:
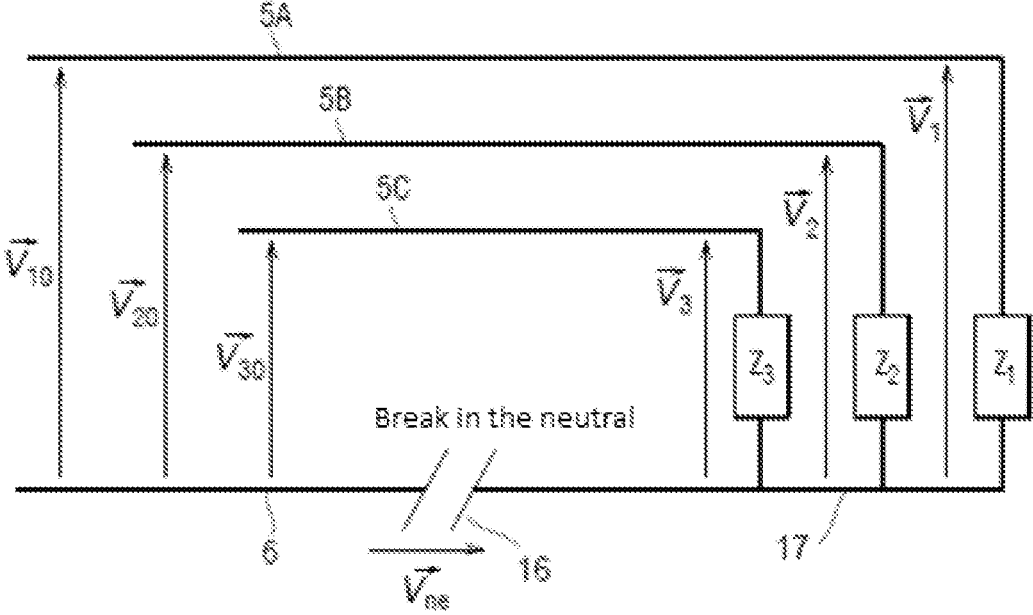
FIG. 4 shows the influence of a break in the connection of a neutral on the phase voltages of the distribution network shown in FIG. 1.

In reference to FIG. 4, it is assumed that a break in the connection of the neutral 6 occurs in the distribution network 1 at a break point 16 situated upstream of the first meter 7. The term "upstream" should be understood to mean on the generation unit 2 side, and the term "downstream" should be understood to mean on the first installation 3 side.

When the break in the connection of the neutral 6 occurs, a node 17 becomes a floating node.

The first phase voltage $V_1$ downstream of the break point 16 then balances spontaneously according to the first impedance $Z_1$ of the first installation 3. The first impedance $Z_1$ therefore has the first phase voltage $V_1$ at its terminals, which is the voltage carried by the first phase 5A downstream of the break point 16. The first phase voltage $V_1$ is expressed as function of a first nominal phase voltage $V_{10}$ (which is the voltage carried by the first phase 5A upstream of the break point 16) and a difference in potential $V_{ne}$ induced by the break in the connection of the neutral 6:

$$V_1 = V_{10} - V_{ne}.$$

Similarly, the second phase voltage $V_2$ downstream of the break point 16 balances spontaneously according to the second impedance $Z\,2$ of the first installation 3. The second impedance $Z\,2$ therefore has the second phase voltage $V_2$ at its terminals, which is the voltage carried by the second phase 5B downstream of the break point 16. The first phase voltage $V_2$ is expressed as function of a second nominal phase voltage $V_{20}$ (which is the voltage carried by the second phase 5B upstream of the break point 16) and the difference in potential $V_{ne}$:

$$V_2 = V_{20} - V_{ne}.$$

Similarly, the third phase voltage $V_3$ downstream of the break point 16 balances spontaneously according to the third impedance $Z_3$ of the first installation 3. The third impedance $Z_3$ therefore has the third phase voltage $V_3$ at its terminals, which is the voltage carried by the third phase 5C downstream of the break point 16. The third phase voltage $V_3$ is expressed as function of a third nominal phase voltage $V_{30}$ (which is the voltage carried by the third phase 5C upstream of the break point 16) and the difference in potential $V_{ne}$:

$$V_3 = V_{30} - V_{ne}.$$

It should be noted that, when the neutral 6 is connected correctly, $V_1 = V_{10}$, $V_2 = V_{20}$ and $V_3 = V_{30}$.

Figure 5:
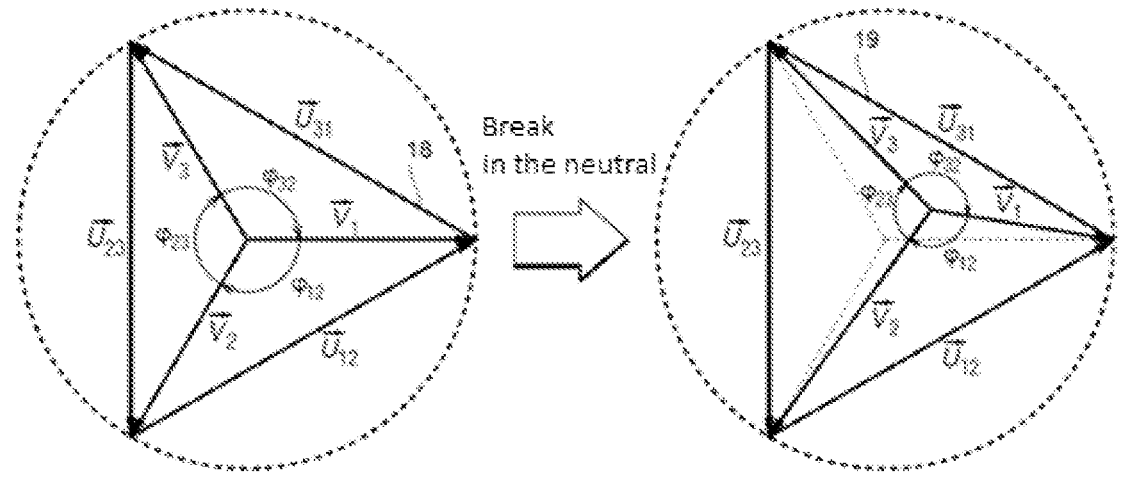
FIG. 5 shows the influence of a break in the connection of a neutral on the phase voltages of the distribution network shown in FIG. 1 in the Fresnel diagram.

In reference to FIG. 5, the Fresnel diagram shows the influence of the break in connection of the neutral 6.

It is interesting to note that the break in the connection of the neutral 6 causes the first phase voltage $V_1$, the second phase voltage $V_2$ and the third phase voltage $V_3$ to rebalance with each other. Except in the specific scenario in which the first, second and third electrical impedances $Z_1$, $Z_2$, $Z_3$ are perfectly balanced in the first, second and third phases 5A, 5B, 5C, the new balance will be different from the initial balance (when the neutral 6 was connected correctly).

The new balance involves a variation in the root mean square value of the first phase voltage $V_{1eff}$, the root mean square value of the second phase voltage $V_{2eff}$ and the root mean square value of the third phase voltage $V_{3eff}$ which are then no longer necessarily equal to the nominal root mean square value of the phase voltage $V_{nom}$.

The new balance also involves a variation in the first phase shift $\varphi_{12}$, the second phase shift $\varphi_{23}$ and the third phase shift $\varphi_{31}$ which are then no longer all necessarily equal to 120°.

However, the new balance retains the first line-to-line voltage $U_{12}$, the second line-to-line voltage $U_{23}$ and the third line-to-line voltage $U_{31}$.

Figure 6:
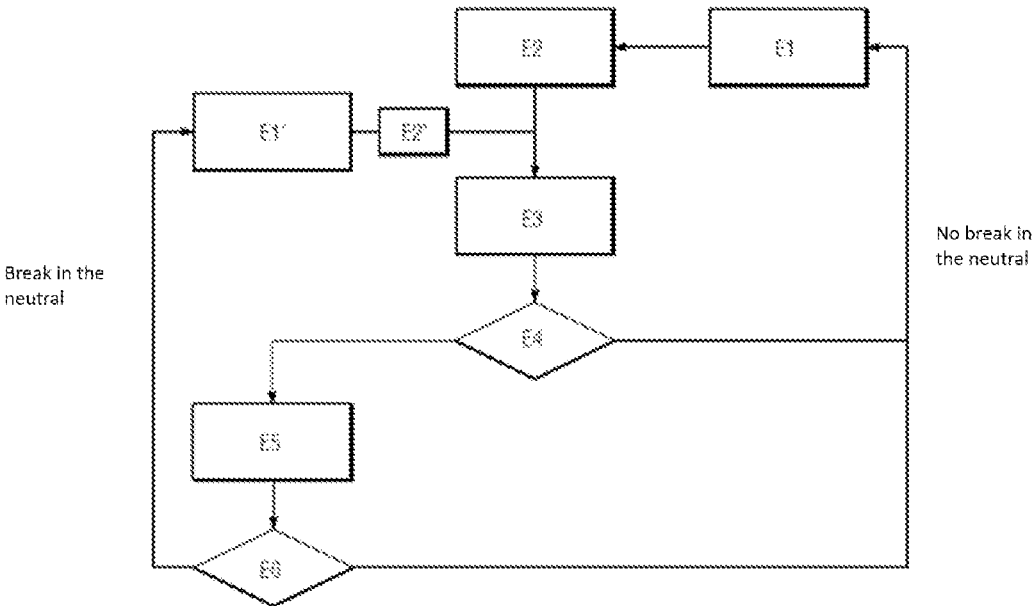
FIG. 6 shows the steps of the method for detecting a break in the connection of a neutral according to the invention.

In reference to FIG. 6, the steps of the method for detecting a break in the connection of a neutral according to the invention is now described.

The detection method according to the invention is implemented in the processing unit 7A of the first meter 7. More particularly, the detection method according to the invention is implemented continuously by the processing unit 7A of the first meter. The steps of said detection method are therefore repeated regularly over time.

The method starts at a time T by acquiring the first phase voltage $V_1$ between the first phase 5A and the neutral 6, the second phase voltage $V_2$ between the second phase and the neutral 6 and the third phase voltage $V_3$ between the third phase 5C and the neutral 6 (step E1).

More specifically, the processing unit 7A acquires the first measurement samples representative of the first phase voltage $V_1$, the second measurement samples representative of the second phase voltage $V_2$ and the third measurement samples representative of the third phase voltage $V_3$. The first measurement samples, the second measurement samples and the third measurement samples are transmitted to the processing unit 7A by the voltage sensors 7D.

Using the first measurement samples, the second measurement samples and the third measurement samples, respectively, the processing unit 7A determines (possibly by applying calibration parameters) a root mean square value of the first phase voltage $V_{1eff}$, a root mean square value of the second phase voltage $V_{2eff}$ and a root mean square value of the third phase voltage $V_{3eff}$. The root mean square values $V_{1eff}$, $V_{2eff}$ and $V_{3eff}$ are in this instance determined respectively by the processing unit 7A each second based on the first, second and third measurement samples acquired the previous second. The root mean square values $V_{1eff}$, $V_{2eff}$ and $V_{3eff}$ could also be determined over a sliding second or over any other appropriate time window.

The processing unit 7A next defines and/or updates a predetermined reference criterion (step E2). The predetermined reference criterion will be described below.

It should be noted that step E2 is optional. Indeed, the predetermined reference criterion may be determined a single time during the installation of the first meter 7 in the distribution network 1 (the predetermined reference criterion being stored in the memory 7B). The predetermined reference criterion could also be defined and/or updated during maintenance of the first meter 7.

The processing unit 7A then evaluates a first quantity representative of a ratio between a maximum phase voltage and a minimum phase voltage from the first, second and third phase voltages $V_1$, $V_2$, $V_3$ (step E3). More specifically, the first quantity is in this instance a number M that is determined by using the following formula:

$$M = \frac{\max(V_{1eff}, V_{2eff}, V_{3eff})}{\min(V_{1eff}, V_{2eff}, V_{3eff})}.$$

Evaluating the first quantity M makes it possible to check whether or not there is an imbalance between the first, second and third phase voltages $V_1$, $V_2$, $V_3$.

To this end, the first quantity M is compared to a predetermined threshold (step E4). The predetermined threshold is in this instance equal to 1.2 in order to take into account, in particular, normal dispersions of the first, second and third phase voltages $V_1$, $V_2$, $V_3$ (intrinsic in the distribution network 1). If the first quantity M is greater than the predetermined threshold, there is a significant imbalance between the first, second and third phase voltages $V_1$, $V_2$, $V_3$, and this constitutes a first indicator of a suspected break in the connection of the neutral 6 in the distribution network 1 upstream of the first meter 7.

However, the simple fact that the first quantity M is greater than the predetermined threshold is not sufficient to be certain that a break in connection of the neutral 6 has actually occurred. In particular, a simple break in the connection of one phase (from the first, second and third phase 5A, 5B, 5C) could also lead to the same observation (the first quantity M is greater than the predetermined threshold). It is therefore necessary to confirm the suspected break in the connection of the neutral 6 by determining an indicator that is characteristic of a break in the connection of a neutral in a three-phase electricity network.

It should be noted that, if the first quantity M is less than the predetermined threshold, the detection method according to the invention determines that there is no break in the connection of the neutral 6, and therefore returns to step E1.

If the first quantity is greater than the predetermined threshold, the processing unit 7A evaluates, based on the first, second and third phase voltages $V_1$, $V_2$, $V_3$, at least one second quantity representative of a current balance between said first, second and third phase voltages (step E5). Indeed, as shown in FIG. 5, the break in the connection of a neutral gives rise to a new balance between the first, second and third phase voltages $V_1$, $V_2$, $V_3$.

The processing unit 7A then detects whether the at least one second quantity satisfies the predetermined reference criterion.

Several methods are now possible and, in particular, several different second quantities as well as several predetermined reference criteria can be defined in order to effectively confirm that a break in the connection of the neutral 6 has occurred.

According to a first embodiment, the at least one second quantity comprises a second quantity G2 that is a function of a sum of the pairwise products of the first, second and third phase voltages $V_1$, $V_2$, $V_3$. More specifically, the second quantity G2 is a function of a sum of pairwise products of root mean square values of the first, second and third phase voltages $V_{1eff}$, $V_{2eff}$, $V_{3eff}$ The approach proposed here is based on the fact that, when there is a suspected break in the neutral connection, the first, second and third phase voltages $V_1$, $V_2$, $V_3$ become balanced according to the new balance, which is not completely random.

If one of the root mean square values of a phase voltage from the root mean square values of the first, second and third phase voltages $V_{1eff}$, $V_{2eff}$, $V_{3eff}$ decreases sharply, while the other two root mean square values remain constant, this does not indicate a break in the connection of the neutral 6. For example, if the root mean square value $V_{1eff}$ decreases sharply while the root mean square values $V_{2eff}$ and $V_{3eff}$ remain constant, it is rather a question of a voltage dip in the first phase 5A or a break in the connection of said first phase 5A. However, if one of the root mean square values of a phase voltage from the root mean square values of the first, second and third phase voltages $V_{1eff}$, $V_{2eff}$, $V_{3eff}$ decreases sharply and, at the same time, one of the two other root mean square values increases (or indeed the two root mean square values increase) it is highly probable that this is linked to a break in the connection of the neutral 6. For example, if the root mean square value $V_{1eff}$ decreases sharply and the root mean square values $V_{2eff}$ and $V_{3eff}$ simultaneously increase, it is highly likely that this is linked to a break in the connection of the neutral 6.

Similarly, if one of the root mean square values of a phase voltage from the root mean square values of the first, second and third phase voltages $V_{1eff}$, $V_{2eff}$, $V_{3eff}$ increases sharply, while the other two root mean square values remain constant, this does not indicate a break in the connection of the neutral 6.

In order to confirm the suspected break in the connection of the neutral 6, the processing unit 7A calculates the second quantity G2 by using the following formula:

$$G2 = \sqrt{\frac{1}{3}(V_{1eff}V_{2eff} + V_{2eff}V_{3eff} + V_{3eff}V_{1eff})},$$

where $V_{1eff}$, $V_{2eff}$ and $V_{3eff}$ are respectively the root mean square value of the first phase voltage, the root mean square value of the second phase voltage and the root mean square value of the third phase voltage.

The second quantity G2 is proposed because it is limited when a break in the connection of the neutral 6 occurs. In the first embodiment, the predetermined reference criterion which is defined by the processing unit 7A is therefore to check that the second quantity G2 is limited between a lower limit BornInf and an upper limit BornSup: BorneInf≤G2≤BorneSup.

In order to correctly define BornInf and BornSup, the detection method further comprises the steps of:
  detecting whether the first, second and third phase voltages $V_1$, $V_2$, $V_3$ are perfectly balanced, i.e., whether or not the root mean square value of the first phase voltage $V_{1eff}$, the root mean square value of the second phase voltage $V_{2eff}$ and the root mean square value of the third phase voltage $V_{3eff}$ are all equal to the nominal root mean square value of the phase voltage $V_{nom}$ of the distribution network 1:

$V_{1eff}=V_{nom}$ and $V_{2eff}=V_{nom}$ and $V_{3eff}=V_{nom}$, if this condition is met, defining BorneInf and BorneSup as follows:

$BorneInf = V_{nom}$ and $$BorneSup = \sqrt{\frac{2\sqrt{3}+1}{4}}\, V_{nom}.$$

Otherwise, if said condition is not met, and therefore if:
  $V_{1eff}=\alpha_1 \cdot V_{nom}$ and $V_{2eff}=\alpha_2 \cdot V_{nom}$, and $V_{3eff}=\alpha_3 \cdot V_{nom}$, where $a_1$, $a_2$ and $a_3$ are real coefficients such that $\alpha_1 \neq \alpha_2 \neq \alpha_3$ and $V_{nom}$ is said nominal root mean square value:
BorneInf=min(B1, B2, B3, B4, B5, B6) and
BornSup=max(B1, B2, B3, B4, B5, B6),
where $$B1 = \sqrt{\frac{\sqrt{(a_1^2 + a_2^2 + a_1 a_2)(a_1^2 + a_3^2 + a_1 a_3)}}{3}}\, V_{nom},$$

US 12,571,823 B2

13

-continued $$B2 = \sqrt{\frac{\sqrt{(a_2^2 + a_3^2 + a_2 a_3)(a_2^2 + a_1^2 + a_2 a_1)}}{3}} V_{nom},$$

$$B3 = \sqrt{\frac{(a_3^2 + a_1^2 + a_3 a_1)(a_3^2 + a_2^2 + a_3 a_2)}{3}} V_{nom},$$

$$B4 = \sqrt{\frac{2\sqrt{(4a_1^2 + a_2^2 + a_3^2 + 2a_1 a_2 + 2a_1 a_3 - a_2 a_3)(a_2^2 + a_3^2 + a_2 a_3)} + (a_2^2 + a_3^2 + a_2 a_3)}{12}} V_{nom},$$

$$B5 = \sqrt{\frac{2\sqrt{(4a_2^2 + a_3^2 + a_1^2 + 2a_2 a_3 + 2a_2 a_1 - a_3 a_1)(a_3^2 + a_1^2 + a_3 a_1)} + (a_3^2 + a_1^2 + a_3 a_1)}{12}} V_{nom},$$

$$B6 = \sqrt{\frac{2\sqrt{(4a_3^2 + a_1^2 + a_2^2 + 2a_3 a_1 + 2a_3 a_2 - a_1 a_2)(a_1^2 + a_2^2 + a_1 a_2)} + (a_1^2 + a_2^2 + a_1 a_2)}{12}} V_{nom}.$$

Annex 1 proposes a mathematical demonstration for determining the expression of BornInf and BornSup.

If the second quantity G2 is limited between the lower limit BornInf and the upper limit BornSup (i.e., if the second quantity G2 satisfies the predetermined reference criterion), the detection method according to the invention detects a break in the neutral connection at the time T upstream of the first meter 7.

In the first embodiment, it is also possible to detect a break in the connection of the neutral 6 when one phase from the first, second and third phases 5A, 5B, 5C is disconnected. In this instance, the third phase 5C is considered to be disconnected. If a break occurs in the connection of the neutral 6, there is a characteristic relation between the root mean square value of the first phase voltage $V_{1\mathit{eff}}$ and the root mean square value of the second phase voltage $V_{2\mathit{eff}}$.

If the first, second and third phase voltages $V_1$, $V_2$, $V_3$ are perfectly balanced, i.e., if: $V_{1\mathit{eff}}=V_{nom}$, and $V_{2\mathit{eff}}=V_{nom}$ and $V_{3\mathit{eff}}=V_{nom}$, the characteristic relation is the following:
$V_{1\mathit{eff}}+V_{2\mathit{eff}}=\sqrt{3}V_{nom}$, where $V_{nom}$ is the nominal root mean square value of the phase voltage.

If the first, second and third phase voltages $V_1$, $V_2$, $V_3$ are not perfectly balanced, i.e., if: $V_{1\mathit{eff}}=\alpha_1 \cdot V_{nom}$ and $V_{2\mathit{eff}}=\alpha_2 \cdot V_{nom}$ and $V_{3\mathit{eff}}=\alpha_3 \cdot V_{nom}$, $(\alpha_1 \neq \alpha_2 \neq \alpha_3)$ the characteristic relation is the following:
$V_{1\mathit{eff}}+V_{2\mathit{eff}}=V_{nom}\sqrt{\alpha_1^2+\alpha_2^2+\alpha_1\alpha_2}$, where $V_{nom}$ is the nominal root mean square value of the phase voltage.

A more complete and detailed algorithm for implementing the detection method according to the first embodiment of the invention is presented in Annex 2.

According to a second embodiment, the detection method comprises the step of evaluating the at least one second quantity which comprises a second quantity A that is a function of an area of an actual triangle 19 formed by the first, second and third phase voltages $V_1$, $V_2$, $V_3$ in the Fresnel diagram.

The actual triangle 19 has a first edge constituted by the first line-to-line voltage $U_{12}$, a second edge constituted by the second line-to-line voltage $U_{23}$ and a third edge constituted by the third line-to-line voltage $U_{31}$.

The second quantity A is determined by the processing unit 7A by using the formula:

$$A = \frac{1}{2}(V_{1\mathit{eff}}V_{2\mathit{eff}}\sin\varphi_{12} + V_{2\mathit{eff}}V_{3\mathit{eff}}\sin\varphi_{23} + V_{3\mathit{eff}}V_{1\mathit{eff}}\sin\varphi_{31}),$$

14 where A is the second quantity (which is the area of the actual triangle 19), $V_{1\mathit{eff}}$, $V_{2\mathit{eff}}$ and $V_{3\mathit{eff}}$ are respectively the root mean square values of the first, second and third phase voltages, and $\varphi_{12}$ is the first phase shift, $\varphi_{23}$ is the second phase shift and $\varphi_{31}$ is the third phase shift. The first phase shift $\varphi_{12}$, the second phase shift $\varphi_{23}$ and the third phase shift $\varphi_{31}$ are determined by the processing unit 7A based on the first, second and third phase voltages $V_1$, $V_2$, $V_3$ via a zero-crossing method and appropriate filtering.

The reference criterion is then that the second quantity A is such that: $A_{ref}-\varepsilon_1 \leq A \leq A_{ref}+\varepsilon_1$, where $A_{ref}$ is a predetermined area of a reference triangle 18 and $\varepsilon_1$ is a first predetermined measurement uncertainty (typically, +/−1% or +/−2%).

In reference to FIG. 5, the area of the reference triangle 18 $A_{ref}$ is actually the area of the triangle formed by the first, second and third phase voltages $V_1$, $V_2$, $V_3$ in the Fresnel diagram in nominal conditions (i.e., when there is no break in the connection of the neutral 6).

Indeed, it is interesting to note that the area of the reference triangle 18 and the area of the actual triangle 19 are similar in the event of a break in the connection of the neutral 6. Therefore, by comparing the second quantity A (the area of the actual triangle 19) with the predetermined area of the reference triangle 18 $A_{ref}$, it is possible to effectively determine whether a break in the connection of the neutral 6 has occurred.

In order to correctly define the area of the reference triangle 18 $A_{ref}$, the detection method further comprises the steps of:
detecting whether the first, second and third phase voltages $V_1$, $V_2$, $V_3$ are perfectly balanced, i.e., whether or not the root mean square value of the first phase voltage V left-, the root mean square value of the second phase voltage $V_{2\mathit{eff}}$ and the root mean square value of the third phase voltage $V_{3\mathit{eff}}$ are all equal to the nominal root mean square value of the phase voltage $V_{nom}$, of the distribution network 1:

$V_{1\mathit{eff}}=V_{nom}$ and $V_{2\mathit{eff}}=V_{nom}$ and $V_{3\mathit{eff}}=V_{nom}$, if this condition is met, the area of the reference triangle 18 is evaluated by using the formula:

$$A_{ref} = \frac{3\sqrt{3}}{4}V_{nom},$$

where $V_{nom}$ is the nominal root mean square value of the phase voltage.
Otherwise, if said condition is not met, and therefore if:
$V_{1\mathit{eff}}=\alpha_1 \cdot V_{nom}$ and $V_{2\mathit{eff}}=\alpha_2 \cdot V_{nom}$, and $V_{3\mathit{eff}}=\alpha_3 \cdot V_{nom}$, where $a_1$, $a_2$ and $a_3$ are real coefficients such that $\alpha_1 \neq \alpha_2 \neq \alpha_3$ and $V_{nom}$ is said nominal root mean square value, the area of the reference triangle 18 is evaluated by using the formula:

$$A_{ref} = (a_1 a_2 + a_2 a_3 + a_3 a_1)\frac{\sqrt{3}}{4}V_{nom},$$

where $V_{nom}$ is said nominal root mean square value of the phase voltage.
If the second quantity A satisfies the predetermined reference criterion, the detection method according to the invention detects a break in the neutral connection at the time T upstream of the first meter 7.

According to a third embodiment of the invention, the at least one second quantity comprises second quantities which comprise the first line-to-line voltage $U_{12}$, the second line-to-line voltage $U_{23}$ and the third line-to-line voltage $U_{31}$.

In reference to FIG. 5, in the event of a break in the connection of the neutral 6, the first line-to-line voltage $U_{12}$, the second line-to-line voltage $U_{23}$ and the third line-to-line voltage $U_{31}$ remain constant.

The reference criterion checked by the processing unit 7A is therefore that of checking whether:

$$\Phi_1 \varepsilon_2 \le U_{12} \le \Phi_1 + \varepsilon_2 \text{ and}$$

$$\Phi_2 - \varepsilon_2 \le U_{23} \le \Phi_2 + \varepsilon_2 \text{ and}$$

$$\Phi_3 - \varepsilon_2 \le U_{31} \le \Phi_3 + \varepsilon_2,$$

where $\Phi_1$, $\Phi_2$ and $\Phi_3$ are respectively reference values of the first, second and third line-to-line voltages $U_{12}$, $U_{23}$, $U_{31}$ measured during operation at a reference time $T_0$ preceding the time T and $\varepsilon_2$ is a second predetermined measurement uncertainty (typically, +/−1% or +/−2%).

If the second quantities $U_{12}$, $U_{23}$ and $U_{31}$ satisfy the predetermined reference criterion, the detection method according to the invention detects a break in the neutral connection at the time T upstream of the first meter 7.

According to a fourth embodiment of the invention, the detection method comprises the step of evaluating the at least one second quantity which comprises second quantities which comprise the first phase shift $\Phi_{12}$, the second phase shift $\Phi_{23}$ and the third phase shift $\Phi_{31}$.

In reference to FIG. 5, it is interesting to note that the first phase shift $\Phi_{12}$, the second phase shift $\Phi_{23}$ and the third phase shift $\Phi_{31}$ are no longer equal to 120° when a break in the connection of the neutral 6 occurs.

The reference criterion defined by the processing unit 7A is then satisfied if the first, second and third phase shifts $\Phi_{12}$, $\varphi_{23}$, $\Phi_{31}$ are each non-zero and different to 120 degrees.

If the first, second and third phase shifts $\Phi_{12}$, $\Phi_{23}$, $\Phi_{31}$ satisfy the predetermined reference criterion, the detection method according to the invention detects a break in the neutral connection at the time T upstream of the first meter 7.

In the four embodiments of the invention disclosed above, if the second quantity or quantities do not satisfy the predetermined reference criterion, the detection method moves on to step E1', which is similar to step E1, and possibly includes a step E2' which is similar to step E2.

In the four embodiments of the invention disclosed above, a suitable margin of uncertainty, relating in particular to the accuracy of the voltage sensors 7D of the first meter 7, is to be taken into consideration. Typically, the margin of uncertainty is in the region of +/−1% or +/−2%.

In the four embodiments of the invention disclosed above, the expressions used for the definition of the predetermined reference criterion (BornInf, BornSup, $A_{ref}$, $\Phi_1$, $\Phi_2$ and $\Phi_3$) could be determined by the processing unit 7A by means of several successive calculations in order to mitigate parasitic phenomena (such as a transient overvoltage of the shock-wave or micro-cut-off type) that could decrease the reliability of the detection method according to the invention. The use of an averaging technique is quite feasible assuming that the distribution network 1 is stable for a given time period.

Irrespective of the embodiment, the detection method according to the invention is implemented continuously by the processing unit 7A of the first meter. The steps of said detection method are therefore repeated regularly over time.

Advantageously, and irrespective of the embodiment, the detection method according to the invention may further comprise the step of detecting a break in connection of the neutral 6 when it has been detected that the second quantity satisfies the predetermined reference criterion a predetermined number of times (for example, 10 times), corresponding to consecutive instances it is satisfied (i.e., consecutive implementations of the detection method) spaced apart two by two in time by a predetermined duration (for example, 1 second). This increases the reliability of the detection method according to the invention.

Optionally, when a break in the neutral connection has effectively been detected, the detection method may further comprise the step of generating an alarm signal that can be timestamped in the memory 7B of the first meter 7 and/or that can be transmitted (via the communication module 7C) to an item of equipment external to said first meter 7, for example an information system of the distribution network 1.

Optionally, the alarm signal may be the displaying of a specific message on a local display of the first meter 7 and/or the alarm signal may be the illumination of an indicator light located on said first meter 7 and/or the issuing of a sound signal by a loudspeaker of the first meter 7.

Ideally, all of the electricity meters of the distribution network 1 are similar and are arranged to implement the detection method according to the invention. Therefore, the whole of the distribution network 1 is monitored correctly.

Optionally, when a break in the neutral connection has effectively been detected and the imbalance between the first, second and third phase voltages is considered to be too great, the detection method may further comprise the step, if said detection method is implemented in a specific meter comprising a breaker, of opening said breaker in order to protect one or more electrical installations downstream of said specific meter.

Naturally, the invention is not limited to the described embodiments, but covers any variant that falls within the scope of the invention as defined by the claims.

It is quite possible to freely combine the different embodiments disclosed above. Therefore, the processing unit 7A of the first meter 7 may determine several second quantities, for example the second quantity G2 (disclosed in the first embodiment) and the second quantity A (disclosed in the second embodiment). This could increase the reliability of the detection method according to the invention.

The voltage sensors 7D of the first meter 7 comprising a first ADC 13, a second ADC 14 and a third ADC 15 have been disclosed, but the voltage sensors 7D may quite possibly comprise a single ADC comprising three distinct inputs each respectively acquiring the first phase voltage, the second phase voltage and the third phase voltage.

Annex 1: Formal Demonstration of the Relations Proposed for the First Embodiment The assumption for the present demonstration is that the first, second and third phase voltages $V_1$, $V_2$, $V_3$ are perfectly balanced, i.e., that the root mean square values $V_{1eff}$, $V_{2eff}$, $V_{3eff}$ are all equal to the nominal root mean square value of the phase voltage $V_{nom}$. This is not necessarily accurate in practice, but can be used as a first approach.

It should be noted that voltages in the demonstration are in vector form and that, throughout the demonstration, they are complex root mean square values.

In reference to FIG. 4, once a break in the neutral connection has occurred, it is possible to write:

$$\vec{V_{10}}-\vec{V_1}=\vec{V_{ne}}$$

$$\vec{V_{20}}-\vec{V_2}=\vec{V_{ne}}$$

$$\vec{V_{30}}-\vec{V_3}=\vec{V_{ne}}$$

$$\vec{I_1}+\vec{I_2}+\vec{I_3}=0$$

$I_1$, $I_2$, I=are the electric currents flowing respectively through the first phase 5A, the second phase 5B and the third phase 5C.

$$\frac{\vec{V_{10}}}{Z_1} + \frac{\vec{V_{20}}}{Z_2} + \frac{\vec{V_{30}}}{Z_3} = \vec{V_{ne}}\left(\frac{1}{Z_1} + \frac{1}{Z_2} + \frac{1}{Z_3}\right)$$

Using a first admittance $Y_1$, a second admittance $Y_2$ and a third admittance $Y_3$ ($Y_1=1/Z_1$, $Y_2=1/Z_2$, $Y_3=1/Z_3$), the following applies:

$$\vec{V_{10}}Y_1+\vec{V_{20}}Y_2+\vec{V_{30}}Y_3=\vec{V_{ne}}(Y_1+Y_2+Y_3)$$

Substitution $\vec{V_{ne}}$: (1) is carried out $$\vec{V_{10}}Y_1+\vec{V_{20}}Y_2+\vec{V_{30}}Y_3=(\vec{V_{10}}-\vec{V_1})(Y_1+Y_2+Y_3)$$

Calculation of $V_1$

Since:

$$V_{20} = V_{10}\left(-\frac{1}{2} - j\frac{\sqrt{3}}{2}\right)$$

$$V_{30} = V_{10}\left(-\frac{1}{2} + j\frac{\sqrt{3}}{2}\right)$$

Based on the relation (1), the following applies:

$$V_{10}\left(Y_1 + \left(-\frac{1}{2} - j\frac{\sqrt{3}}{2}\right)Y_2 + \left(-\frac{1}{2} + j\frac{\sqrt{3}}{2}\right)Y_3\right) = (V_{10} - V_1)(Y_1 + Y_2 + Y_3)$$

$$V_{10}\left[\left(Y_1 - \frac{1}{2}Y_2 - \frac{1}{2}Y_3 - Y_1 - Y_2 - Y_3\right) + j\frac{\sqrt{3}}{2}(Y_3 - Y_2)\right] =$$

$$-V_1(Y_1 + Y_2 + Y_3)$$

$$V_1 = V_{10}\left[\frac{\left(\frac{3}{2}Y_2 + \frac{3}{2}Y_3\right)}{(Y_1 + Y_2 + Y_3)} + j\frac{\sqrt{3}}{2}\frac{(Y_2 - Y_3)}{(Y_1 + Y_2 + Y_3)}\right]$$

Applying the modulus gives: (2)

$$V_1 = V_{10}\sqrt{\left(\frac{\frac{3}{2}(Y_2 + Y_3)}{(Y_1 + Y_2 + Y_3)}\right)^2 + \left(\frac{\sqrt{3}}{2}\frac{(Y_2 - Y_3)}{(Y_1 + Y_2 + Y_3)}\right)^2}$$

Calculation of $V_2$

Based on the relation (1), the following applies:

$$V_{10}\left(Y_1 + \left(-\frac{1}{2} - j\frac{\sqrt{3}}{2}\right)Y_2 + \left(-\frac{1}{2} + j\frac{\sqrt{3}}{2}\right)Y_3\right) = (V_{20} - V_2)(Y_1 + Y_2 + Y_3)$$

Since:

$$V_{20} = V_{10}\left(-\frac{1}{2} - j\frac{\sqrt{3}}{2}\right)$$

It follows that:

$$V_{10}\left[\left(Y_1 - \frac{1}{2}Y_2 - \frac{1}{2}Y_3 + \frac{1}{2}Y_1 + \frac{1}{2}Y_2 + \frac{1}{2}Y_3\right) + \right.$$

$$\left. j\frac{\sqrt{3}}{2}(Y_3 - Y_2 + Y_1 + Y_2 + Y_3)\right] = -V_2(Y_1 + Y_2 + Y_3)$$

$$V_2 = V_{10}\left(\frac{\left(-\frac{3}{2}Y_1\right)}{(Y_1 + Y_2 + Y_3)} - j\frac{\sqrt{3}}{2}\frac{(2 \times Y_3 + Y_1)}{(Y_1 + Y_2 + Y_3)}\right)$$

Applying the modulus gives: (3)

$$V_2 = V_{10}\sqrt{\left(-\frac{\frac{3}{2}Y_1}{(Y_1 + Y_2 + Y_3)}\right)^2 + \left(-\frac{\sqrt{3}}{2}\frac{(2 \times Y_3 + Y_1)}{(Y_1 + Y_2 + Y_3)}\right)^2}$$

Calculation of $V_3$

Based on the relation (1), the following applies:

$$V_{10}\left(Y_1 + \left(-\frac{1}{2} - j\frac{\sqrt{3}}{2}\right)Y_2 + \left(-\frac{1}{2} + j\frac{\sqrt{3}}{2}\right)Y_3\right) = (V_{30} - V_3)(Y_1 + Y_2 + Y_3)$$

Since:

$$V_{30} = V_{10}\left(-\frac{1}{2} + j\frac{\sqrt{3}}{2}\right)$$

It follows that:

$$V_{10}\left[\left(Y_1 - \frac{1}{2}Y_2 - \frac{1}{2}Y_3 + \frac{1}{2}Y_1 + \frac{1}{2}Y_2 + \frac{1}{2}Y_3\right) + \right.$$

$$\left. j\frac{\sqrt{3}}{2}(Y_3 - Y_2 - Y_1 - Y_2 - Y_3)\right] = -V_2(Y_1 + Y_2 + Y_3)$$

$$V_3 = V_{10}\left(\frac{\left(-\frac{3}{2}Y_1\right)}{(Y_1 + Y_2 + Y_3)} + j\frac{\sqrt{3}}{2}\frac{(2 \times Y_2 + Y_1)}{(Y_1 + Y_2 + Y_3)}\right)$$

Applying the modulus gives: (4)

$$V_3 = V_{10}\sqrt{\left(-\frac{\frac{3}{2}Y_1}{(Y_1 + Y_2 + Y_3)}\right)^2 + \left(\frac{\sqrt{3}}{2}\frac{(2 \times Y_2 + Y_1)}{(Y_1 + Y_2 + Y_3)}\right)^2}$$

Using the relation (2), (3) and (4) and positing $V_{10}=V_{nom}$ gives:

$$V_1V_2+V_1V_3+V_2V_3=V_{nom}^2 f(Y_1,Y_2,Y_3)$$

Where:

$$f(Y_1, Y_2, Y_3) =$$

$$\sqrt{\left(\left(\frac{\frac{3}{2}(Y_2 + Y_3)}{(Y_1 + Y_2 + Y_3)}\right)^2 + \left(\frac{\sqrt{3}}{2}\frac{(Y_2 - Y_3)}{(Y_1 + Y_2 + Y_3)}\right)^2\right)\left(\left(\frac{\frac{3}{2}Y_1}{(Y_1 + Y_2 + Y_3)}\right)^2 + \left(\frac{\sqrt{3}}{2}\frac{(2 \times Y_3 + Y_1)}{(Y_1 + Y_2 + Y_3)}\right)^2\right)} +$$

$$\sqrt{\left(\left(\frac{\frac{3}{2}(Y_2 + Y_3)}{(Y_1 + Y_2 + Y_3)}\right)^2 + \left(\frac{\sqrt{3}}{2}\frac{(Y_2 - Y_3)}{(Y_1 + Y_2 + Y_3)}\right)^2\right)\left(\left(-\frac{\frac{3}{2}Y_1}{(Y_1 + Y_2 + Y_3)}\right)^2 + \left(\frac{\sqrt{3}}{2}\frac{(2 \times Y_2 + Y_1)}{(Y_1 + Y_2 + Y_3)}\right)^2\right)} +$$

$$\sqrt{\left(\left(\frac{\frac{3}{2}Y_1}{(Y_1 + Y_2 + Y_3)}\right)^2 + \left(\frac{\sqrt{3}}{2}\frac{(2 \times Y_3 + Y_1)}{(Y_1 + Y_2 + Y_3)}\right)^2\right)\left(\left(-\frac{\frac{3}{2}Y_1}{(Y_1 + Y_2 + Y_3)}\right)^2 + \left(\frac{\sqrt{3}}{2}\frac{(2 \times Y_2 + Y_1)}{(Y_1 + Y_2 + Y_3)}\right)^2\right)}$$

$$f(Y_1, Y_2, Y_3) =$$

$$\frac{1}{4(Y_1 + Y_2 + Y_3)^2}\left(\sqrt{(9(Y_2 + Y_3)^2 + 3(Y_3 - Y_2)^2)(9Y_1^2 + 3(Y_1 + 2Y_3)^2)} + \right.$$

$$\sqrt{(9(Y_2 + Y_3)^2 + 3(Y_3 - Y_2)^2)(9Y_1^2 + 3(Y_1 + 2Y_2)^2)} +$$

$$\left.\sqrt{(9Y_1^2 + 3(Y_1 + 2Y_3)^2)(9Y_1^2 + 3(Y_1 + 2Y_2)^2)}\right)$$

$$f(Y_1, Y_2, Y_3) = \frac{3}{(Y_1 + Y_2 + Y_3)^2}\left(\sqrt{(Y_2^2 + Y_2 Y_3 + Y_3^2)(Y_1^2 + Y_1 Y_3 + Y_3^2)} + \right.$$

$$\sqrt{(Y_2^2 + Y_2 Y_3 + Y_3^2)(Y_1^2 + Y_1 Y_2 + Y_2^2)} +$$

$$\left.\sqrt{(Y_1^2 + Y_1 Y_3 + Y_3^2)(Y_1^2 + Y_1 Y_2 + Y_2^2)}\right)$$

Studying the Limit Cases:

Case 1: $Y_1 = Y_2 = Y_3 = Y$:

$$f(Y_1, Y_2, Y_3) = \frac{3}{9Y^2}\left(\sqrt{9Y^4} + \sqrt{9Y^4} + \sqrt{9Y^4}\right) = \frac{3}{9Y^2}9Y^2 = 3$$

Since:

$$V_1 V_2 + V_1 V_3 + V_2 V_3 = V_{nom}^2 f(Y_1, Y_2, Y_3)$$

It follows that (the limit case studied here constituting the lower limit)—$V_i$ and $V_j$ being respectively the phase voltages of the ith phase and jth phase:

$$\sum_{i \ne j} V_i V_j \ge 3 V_{nom}^2$$

Hence:

$$V_{nom} \le \sqrt{\frac{\sum_{i \ne j} V_i V_j}{3}}$$

Case 2: $Y_1 = Y_2 = Y \gg Y_3 = y$:

$$f(Y_1, Y_2, Y_3) =$$

$$\frac{3}{(2Y)^2}\left(\sqrt{(Y^2)(Y^2)} + \sqrt{(Y^2)(3Y^2)} + \sqrt{(Y^2)(3Y^2)}\right) = \frac{3(2\sqrt{3} + 1)}{4}$$

Since:

$$V_1 V_2 + V_1 V_3 + V_2 V_3 = V_{nom}^2 f(Y_1, Y_2, Y_3)$$

It follows that (the limit case studied here constituting the upper limit):

$$\sum_{i \ne j} V_i V_j \le V_{nom}^2 \times \frac{3(2\sqrt{3} + 1)}{4}$$

Hence:

$$\sqrt{\frac{\sum_{i \ne j} V_i V_j}{3}} \le \sqrt{\frac{2\sqrt{3} + 1}{4}} V_{nom}$$

We have shown, by studying limit cases, that the sum of the $V_i V_j$ remained very precisely limited between $V_{nom}$ and $1.056 V_{nom}$ in the event of a break in the neutral connection:

$$BorneInf \le \sqrt{\frac{\sum_{i \ne j} V_i V_j}{3}} \le BorneSup$$

$$BorneInf = V_{nom}$$

$$BorneSup = \sqrt{\frac{2\sqrt{3} + 1}{4}} V_{nom} (= 1.056 \ V_{nom})$$

The proposed formula can then be generalized, by the same calculation process, to take into account initial conditions for which the distribution network does not have perfectly balanced phase voltages, by positing: $V_{1eff} = \alpha_1 \cdot V_{nom}$ and $V_{2eff} = \alpha_2 \cdot V_{nom}$ and $V_{3eff} = \alpha_3 \cdot V_{nom}$, where $a_1$, $a_2$ and $a_3$ are real coefficients such that $\alpha_1 \ne \alpha_2 \ne \alpha_3$.

The fact is that, considering the effect of the initial imbalances between the phase voltages coming from the distribution network, the asymptotic study cases to be considered (which make it possible to obtain a bounded limit of the result expected in the event of a break in the neutral connection) increase from 2 to 6, due to loss of symmetry. The 6 limits are given by:

$$B1 = \sqrt{\frac{\sqrt{(a_1^2 + a_2^2 + a_1 a_2)(a_1^2 + a_3^2 + a_1 a_3)}}{3}} V_{nom},$$

$$B2 = \sqrt{\frac{\sqrt{(a_2^2 + a_3^2 + a_2 + a_3)(a_2^2 + a_1^2 + a_2 a_1)}}{3}} V_{nom},$$

$$B3 = \sqrt{\frac{\sqrt{(a_3^2 + a_1^2 + a_3 a_1)(a_3^2 + a_2^2 + a_3 a_2)}}{3}} V_{nom},$$

$$B4 = \sqrt{\frac{2\sqrt{(4a_1^2 + a_2^2 + a_3^2 + 2a_1 a_2 + 2a_1 a_3 - a_2 a_3)(a_2^2 + a_3^2 + a_2 a_3)} + (a_2^2 + a_3^2 + a_2 a_3)}{12}} V_{nom},$$

-continued $B5 =$ $$\sqrt{\dfrac{2\sqrt{(4a_2^2 + a_3^2 + a_1^2 + 2a_2a_3 + 2a_2a_1 - a_3a_1)(a_3^2 + a_1^2 + a_3a_1)} + (a_3^2 + a_1^2 + a_3a_1)}{12}}\; V_{nom},$$

$$B6 = \sqrt{\dfrac{2\sqrt{(4a_3^2 + a_1^2 + a_2^2 + 2a_3a_1 + 2a_3a_2 - a_1a_2)(a_1^2 + a_2^2 + a_1a_2)} + (a_1^2 + a_2^2 + a_1a_2)}{12}}\; V_{nom}.$$

And Finally:

Where:

$$BorneInf \le \sqrt{\dfrac{\sum_{i \ne j} V_i V_j}{3}} \le BorneSup$$

BorneInf=min(B1, B2, B3, B4, B5, B6) and

BornSup=max(B1, B2, B3, B4, B5, B6).

| Annex 2: Algorithm proposed for the first embodiment |
| --- |

```
// init
Un = 230
U[ ]=[230;230;230]
PhaseConnectStatus[ ] = [UNKNOWN; UNKNOWN; UNKNOWN]
NeutraConnectStatus = UNKNOWN
// param
Vmin = 60
Tol = 10%
N = 2
AlphaThreshold = 20%
DevThresholdLow = 10%
DevThresholdHigh = 20%
MarginLow = 0.5%
MarginHigh = 0.5%
MarginLow_bis = 2%
MarginHigh_bis = 2%
MarginAdd = 5%
Loop every second
    For i = 1 to 3
        cnt_unknwn = 0
        If (V[i] < Vmin)
            PhaseConnectStatus[i] = UNKNOWN
            cnt_unknwn ++
        Else
            PhaseConnectStatus[i] = CONNECTED
        End If
    End For
    For i = 1 to 3
        If V[i] < (1−Tol).Un
            Vtmp = U[i]
        Elsif V[i] > (1+Tol).Un
            Vtmp = U[i]
        Else
            Vtmp = V[i]
        End If
        U[i] = Vtmp/N + (N−1).U[i]/N
        a[i] = U[i]/Un
        Dev[i] = V[i]/U[i]
    End For
    If (cnt_unknwn >= 2)
        For i = 1 to 3
            If (PhaseConnectStatus[i] = UNKNOWN)
                PhaseConnectStatus[i] = DISCONNECTED
            End If
        End For
    End If
    If (cnt_unknwn < 2)
        Alpha = Max(V[ ])/MIN(V[ ])
```

-continued

| Annex 2: Algorithm proposed for the first embodiment |
| --- |

```
    If (((Alpha−1) > AlphaThreshold) AND (((1−MIN(Dev[ ])) >
DevThresholdLow) OR ((MAX(Dev[ ])−1) > DevThresholdHigh)))
        Vref = 0
        For i = 1 to 3
            j = i+1 %3
            k = i+2 %3
            Vref = Vref + V[i].V[j]/3
            Factor1[i] =
SQRT((a[i]²+a[j]²+a[i].a[j]).(a[i]²+a[k]²+a[i].a[k]))
            Factor2[i] =
(2.SQRT((4.a[i]²+a[j]²+a[k]²+2.a[i].a[j]+2.a[i].a[k]−
a[j].a[k]).(a[j]²+a[k]²+a[j].a[k]))+(a[j]²+a[k]²+a[j].a[k]))/4
        End For
        Vref = SQRT(Vref)
        Ulim1[i] = Un.SQRT(Factor1[i]/3)
        Ulim2[i] = Un.SQRT(Factor2[i]/3)
        If (NeutralConnectStatus = DISCONNECTED)
            MarginL = MarginLow + MarginAdd
            MarginH = MarginHigh + MarginAdd
        Else
            MarginL = MarginLow
            MarginH = MarginHigh
        End If
        If ((Vref > (1−MarginL).MIN(MIN(Ulim1[ ]),MIN(Ulim2[ ])))
AND (Vref < (1+MarginH).MAX(MAX(Ulim1[ ]),MAX(Ulim2[ ]))))
            NeutralConnectStatus = DISCONNECTED
            For i = 1 to 3
                If (PhaseConnectStatus[i] = UNKNOWN)
                    PhaseConnectStatus[i] = CONNECTED
                End If
            End For
        Else
            NeutralConnectStatus = CONNECTED
            For i = 1 to 3
                If (PhaseConnectStatus[i] = UNKNOWN)
                    PhaseConnectStatus[i] = DISCONNECTED
                    NeutralConnectStatus = UNKNOWN
                End If
            End For
        End If
    End If
    If (NeutralConnectStatus = UNKNOWN)
        Vref_bis = 0
        For i = 1 to 3
            If (PhaseConnectStatus[i] = CONNECTED)
                Vref_bis = Vref_bis + V[i]
            End If
        End For
        Vref_bis = Vref_bis/2
        For i = 1 to 3
            a_bis[i] = 0
            If (PhaseConnectStatus[i] = CONNECTED)
                a_bis[i] = a[i]
            End If
        End For
        Factor_bis = 0
        For i = 1 to 3
            j = i+1 %3
            Factor_bis = Factor_bis + a_bis[i]² + a_bis[i].a_bis[j]
        End For
        Ulim_bis = Un.SQRT(Factor_bis)/2
        If (NeutralConnectStatus = DISCONNECTED)
            MarginL_bis = MarginLow_bis + MarginAdd
            MarginH_bis = MarginHigh_bis + MarginAdd
        Else
            MarginL = MarginLow
            MarginH = MarginHigh
        End If
        If ((Vref_bis > (1−MarginL_bis).Ulim_bis) AND (Vref_bis <
(1+MarginH_bis).Ulim_bis))
            NeutralConnectStatus = DISCONNECTED
        Else
            NeutralConnectStatus = CONNECTED
```

-continued

| Annex 2: Algorithm proposed for the first embodiment |
| --- |
| End If<br>  End If<br>    End If<br>End Loop |

The invention claimed is:

1. A method for detecting a break in connection of a neutral of a three-phase electricity network, the detection method being implemented at least partially in a processing unit of an item of electrical equipment connected to the electricity network, and comprising the steps, repeated regularly, of:

acquiring, at a time T, a first phase voltage ($V_1$) measured between a first phase of the three-phase electricity network and the neutral, a second phase voltage ($V_2$) measured between a second phase and the neutral, and a third phase voltage ($V_3$) measured between a third phase and the neutral, the first, second and third phase voltages being measured by voltage sensors of the item of electrical equipment;

evaluating a first quantity representative of a ratio between a maximum phase voltage and a minimum phase voltage from the first, second and third phase voltages; and if the first quantity is greater than a predetermined threshold:

evaluating, based only on the first, second and third phase voltages, at least a second quantity representative of a current balance between said first, second and third phase voltages; and detecting a break in connection of the neutral at the time T when the at least one second quantity satisfies a predetermined reference criterion.

2. The detection method according to claim 1, wherein the at least one second quantity comprises a second quantity that is a function of a sum of pairwise products of root mean square values of the first, second and third phase voltages.

3. The detection method according to claim 2, wherein said second quantity G2 is equal to:

$$G2 = \sqrt{\frac{1}{3}(V_{1eff}V_{2eff} + V_{2eff}V_{3eff} + V_{3eff}V_{1eff})},$$

where $V_{1eff}$, $V_{2eff}$ and $V_{3eff}$ are respectively a root mean square value of the first phase voltage ($V_1$), a root mean square value of the second phase voltage ($V_2$) and a root mean square value of the third phase voltage ($V_3$), wherein the predetermined reference criterion being that: BorneInf$\leq$G2$\leq$BorneSup, and wherein BorneInf is a lower limit and BorneSup is an upper limit, which limit the second quantity G2 when a break in connection of the neutral occurs.

4. The detection method according to claim 3, further comprising the steps of:

detecting whether:

$V_{1eff} \leq V_{nom}$ and $V_{2eff} \leq V_{nom}$ and $V_{3eff} \leq V_{nom}$, where $V_{nom}$ is a nominal root mean square value of the phase voltage of the electricity network;

if this condition is met, defining BorneInf and BorneSup as follows:

$$BorneInf = V_{nom} \text{ and } BorneSup = \sqrt{\frac{2\sqrt{3}+1}{4}} V_{nom}.$$

5. The detection method according to claim 4, wherein, if said condition is not met, and if:

$V_{1eff}=\alpha_1 \cdot V_{nom}$ and $V_{2eff}=\alpha_2 \cdot V_{nom}$ and $V_{3eff}=\alpha_3 \cdot V_{nom}$, where $a_1$, $a_2$ and $a_3$ are real coefficients such that $\alpha_1 \neq \alpha_2 \neq \alpha_3$, then:

BorneInf=min(B1, B2, B3, B4, B5, B6) and
BorneSup=max(B1, B2, B3, B4, B5, B6)
where $$B1 = \sqrt{\frac{\sqrt{(a_1^2 + a_2^2 + a_1a_2)(a_1^2 + a_3^2 + a_1a_3)}}{3}} V_{nom},$$

$$B2 = \sqrt{\frac{\sqrt{(a_2^2 + a_3^2 + a_2 + a_3)(a_2^2 + a_1^2 + a_2a_1)}}{3}} V_{nom},$$

$$B3 = \sqrt{\frac{\sqrt{(a_3^2 + a_1^2 + a_3a_1)(a_3^2 + a_2^2 + a_3a_2)}}{3}} V_{nom},$$

$$B4 = \sqrt{\frac{2\sqrt{(4a_1^2 + a_2^2 + a_3^2 + 2a_1a_2 + 2a_1a_3 - a_2a_3)(a_2^2 + a_3^2 + a_2a_3)} + (a_2^2 + a_3^2 + a_2a_3)}{12}} V_{nom},$$

$$B5 = \sqrt{\frac{2\sqrt{(4a_2^2 + a_3^2 + a_1^2 + 2a_2a_3 + 2a_2a_1 - a_3a_1)(a_3^2 + a_1^2 + a_3a_1)} + (a_3^2 + a_1^2 + a_3a_1)}{12}} V_{nom},$$

$$B6 = \sqrt{\frac{2\sqrt{(4a_3^2 + a_1^2 + a_2^2 + 2a_3a_1 + 2a_3a_2 - a_1a_2)(a_1^2 + a_2^2 + a_1a_2)} + (a_1^2 + a_2^2 + a_1a_2)}{12}} V_{nom}.$$

6. The detection method according to claim 1, wherein the at least one second quantity comprises a second quantity that is a function of an area of an actual triangle formed by the first, second and third phase voltages in the Fresnel diagram.

7. The detection method according to claim 6, wherein the area of the actual triangle is determined by using the formula:

$$A = \frac{1}{2}(V_{1eff}V_{2eff}\sin\varphi_{12} + V_{2eff}V_{3eff}\sin\varphi_{23} + V_{3eff}V_{1eff}\sin\varphi_{31}),$$

where A is the second quantity, $V_{1eff}$, $V_{2eff}$ and $V_{3eff}$ are respectively the root mean square values of the first, second and third phase voltages, and $\varphi_{12}$ is a first phase shift between the first phase voltage and the second phase voltage, $\varphi_{23}$ is a second phase shift between the second phase voltage and the third phase voltage and $\varphi_{31}$ is a third phase shift between the third phase voltage and the first phase voltage, the reference criterion then being that the second quantity is such that:

$A_{ref}-\varepsilon_1 \leq A \leq A_{ref}+\varepsilon_1$ where $A_{ref}$ is an area of a reference triangle and $\varepsilon_1$ is a first predetermined measurement uncertainty.

8. The detection method according to claim 7, wherein, if the first, second and third phase voltages are perfectly balanced, the area of the predetermined reference triangle is evaluated by using the formula:

$$A_{ref} = \frac{3\sqrt{3}}{4} V_{nom},$$

where $A_{ref}$ is the area of the reference triangle and $V_{nom}$ is the nominal root mean square value of the phase voltage of the electricity network.

9. The detection method according to claim 1, wherein the at least one second quantity comprises second quantities which comprise a first line-to-line voltage $U_{12}$ representative of a difference between the first phase voltage and the second phase voltage, a second line-to-line voltage $U_{22}$ representative of a difference between the second phase voltage and the third phase voltage and a third line-to-line voltage $U_{31}$ representative of a difference between the third phase voltage and the first phase voltage, the reference criterion then being that:

$$\Phi_1 - \varepsilon_2 \leq U_{12} \leq \Phi_1 + \varepsilon_2 \text{ and}$$

$$\Phi_2 - \varepsilon_2 \leq U_{22} \leq \Phi_2 + \varepsilon_2 \text{ and}$$

$$\Phi_3 - \varepsilon_2 \leq U_{31} \leq \Phi_3 + \varepsilon 2,$$

where $\Phi_1$, $\Phi_2$ and $\Phi_3$ are reference values of the first, second and third line-to-line voltages measured during operation at a reference time $T_0$ preceding the time T and $\varepsilon_2$ is a second predetermined measurement uncertainty.

10. The detection method according to claim 1, wherein the at least one second quantity comprises second quantities that comprise a first phase shift between the first phase voltage ($V_1$) and the second phase voltage ($V_2$), a second phase shift between the second phase voltage ($V_2$) and the third phase voltage ($V_3$) and a third phase shift between the third phase voltage ($V_3$) and the first phase voltage ($V_1$), the predetermined reference criterion then being that the first, second and third phase shifts are each non-zero and different to 120 degrees.

11. The detection method according to claim 1, further comprising the step of detecting a break in the neutral connection when it has been detected that the second quantity satisfies the predetermined reference criterion a predetermined number of times, corresponding to consecutive checks, spaced apart two by two in time by a predetermined duration.

12. The detection method according to claim 1, wherein, when a break in the neutral connection has been detected, the method further comprises the step of generating an alarm signal that can be timestamped in a memory of the electrical equipment and/or that can be transmitted to an external equipment to said electrical equipment.

13. An electrical equipment comprising voltage sensors and a processing unit arranged to implement the detection method according to claim 1.

14. The electrical equipment according to claim 13, the electrical equipment being an electricity meter.

15. A non-transitory computer-readable storage medium on which a computer program comprising instructions that cause an electrical equipment comprising voltage sensors and a processing unit arranged to implement the detection method according to claim 1 is stored.

16. A method for detecting a break in connection of a neutral of a three-phase electricity network, the detection method being implemented at least partially in a processing unit of an item of electrical equipment connected to the electricity network, and comprising the steps, repeated regularly, of:

acquiring, at a time T, a first phase voltage ($V_1$) measured between a first phase of the three-phase electricity network and the neutral, a second phase voltage ($V_2$) measured between a second phase and the neutral, and a third phase voltage ($V_3$) measured between a third phase and the neutral, the first, second and third phase voltages being measured by voltage sensors of the item of electrical equipment;

evaluating a first quantity representative of a ratio between a maximum phase voltage and a minimum phase voltage from the first, second and third phase voltages; and if the first quantity is greater than a predetermined threshold:

evaluating, based on the first, second and third phase voltages, at least a second quantity representative of a current balance between said first, second and third phase voltages; and detecting a break in connection of the neutral at the time T when the at least one second quantity satisfies a predetermined reference criterion, wherein the at least one second quantity comprises a second quantity that is a function of an area of an actual triangle formed by the first, second and third phase voltages in the Fresnel diagram.

17. A method for detecting a break in connection of a neutral of a three-phase electricity network, the detection method being implemented at least partially in a processing unit of an item of electrical equipment connected to the electricity network, and comprising the steps, repeated regularly, of:

acquiring, at a time T, a first phase voltage ($V_1$) measured between a first phase of the three-phase electricity network and the neutral, a second phase voltage ($V_2$) measured between a second phase and the neutral, and a third phase voltage ($V_3$) measured between a third phase and the neutral, the first, second and third phase voltages being measured by voltage sensors of the item of electrical equipment;

evaluating a first quantity representative of a ratio between a maximum phase voltage and a minimum phase voltage from the first, second and third phase voltages; and if the first quantity is greater than a predetermined threshold:

evaluating, based on the first, second and third phase voltages, at least a second quantity representative of a current balance between said first, second and third phase voltages; and detecting a break in connection of the neutral at the time T when the at least one second quantity satisfies a predetermined reference criterion, wherein the at least one second quantity comprises second quantities which comprise a first line-to-line voltage $U_{12}$ representative of a difference between the first phase voltage and the second phase voltage, a second line-to-line voltage $U_{22}$ representative of a difference between the second phase voltage and the third phase voltage and a third line-to-line voltage $U_{31}$ representative of a difference between the third phase voltage and the first phase voltage, the reference criterion then being that:

$$\Phi_1 - \varepsilon_2 \leq U_{12}\Phi_1 + \varepsilon_2 \text{ and}$$

$$\Phi_2 - \varepsilon_2 \leq U_{22} \leq \Phi_2 + \varepsilon_2 \text{ and}$$

$$\Phi_3 - \varepsilon_2 \leq U_{31} \leq \Phi_3 + \varepsilon2,$$

where $\angle_1$, $\Phi_2$ and $\Phi_3$ are reference values of the first, second and third line-to-line voltages measured during operation at a reference time $T_0$ preceding the time T and $\varepsilon_2$ is a second predetermined measurement uncertainty.

18. A method for detecting a break in connection of a neutral of a three-phase electricity network, the detection method being implemented at least partially in a processing unit of an item of electrical equipment connected to the electricity network, and comprising the steps, repeated regularly, of:

acquiring, at a time T, a first phase voltage ($V_1$) measured between a first phase of the three-phase electricity network and the neutral, a second phase voltage ($V_2$) measured between a second phase and the neutral, and a third phase voltage ($V_3$) measured between a third phase and the neutral, the first, second and third phase voltages being measured by voltage sensors of the item of electrical equipment;

evaluating a first quantity representative of a ratio between a maximum phase voltage and a minimum phase voltage from the first, second and third phase voltages;

if the first quantity is greater than a predetermined threshold:

evaluating, based on the first, second and third phase voltages, at least a second quantity representative of a current balance between said first, second and third phase voltages; and detecting a break in connection of the neutral at the time T when the at least one second quantity satisfies a predetermined reference criterion; and detecting whether:

$$V_{1eff}=V_{nom} \text{ and } V_{2eff}=V_{nom} \text{ and } V_{3eff}=V_{nom},$$

where $V_{nom}$ is a nominal root mean square value of the phase voltage of the electricity network;

if this condition is met, defining BorneInf and BorneSup as follows:

$$BorneInf = V_{nom} \text{ and } BorneSup = \sqrt{\frac{2\sqrt{3}+1}{4}} V_{nom},$$

wherein said second quantity G2 is equal to:

$$G2 = \sqrt{\frac{1}{3}(V_{1eff}V_{2eff} + V_{2eff}V_{3eff} + V_{3eff}V_{1eff})},$$

where $V_{1eff}$, $V_{2eff}$ and $V_{3eff}$ are respectively a root mean square value of the first phase voltage ($V_1$), a root mean square value of the second phase voltage ($V_2$) and a root mean square value of the third phase voltage ($V_3$), wherein the predetermined reference criterion being that: BorneInf<G2<BorneSup; and wherein BorneInf is a lower limit and BorneSup is an upper limit, which limit the second quantity G2 when a break in connection of the neutral occurs, and wherein the at least one second quantity comprises a second quantity that is a function of a sum of pairwise products of root mean square values of the first, second and third phase voltages.

* * * * *